(12) United States Patent
Gans et al.

(10) Patent No.: US 6,304,511 B1
(45) Date of Patent: *Oct. 16, 2001

(54) METHOD AND APPARATUS FOR ADJUSTING CONTROL SIGNAL TIMING IN A MEMORY DEVICE

(75) Inventors: Dean Gans; John R. Wilford; Joseph T. Pawlowski, all of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/650,475

(22) Filed: Aug. 29, 2000

Related U.S. Application Data

(63) Continuation of application No. 09/361,025, filed on Jul. 23, 1999, now Pat. No. 6,111,812.

(51) Int. Cl.[7] .................................................. G11C 8/00
(52) U.S. Cl. ........................... 365/233; 365/194; 327/161
(58) Field of Search ................................... 365/233, 194; 326/93; 327/149, 153, 161

(56) References Cited

U.S. PATENT DOCUMENTS

| | | | |
|---|---|---|---|
| 5,646,904 | 7/1997 | Ohno et al. ........................... | 365/194 |
| 5,761,151 | 6/1998 | Hatakeyama ......................... | 365/194 |
| 5,768,177 | 6/1998 | Sakuragi ............................... | 365/194 |
| 5,841,707 | 11/1998 | Cline et al. .......................... | 365/194 |
| 5,886,946 * | 3/1999 | Ooishi .................................. | 365/194 |
| 5,986,949 | 11/1999 | Toda ..................................... | 365/194 |
| 6,111,812 * | 8/2000 | Gans et al. ........................... | 365/233 |

* cited by examiner

*Primary Examiner*—Tan T. Nguyen
(74) *Attorney, Agent, or Firm*—Dorsey & Whitney LLP

(57) ABSTRACT

A method and apparatus is described for selectively adjusting control signal timing in a memory device as a function of the externally applied system clock speed. The memory device includes clock sensing circuitry that receives the system clock signal and responsively produces a speed signal having a value corresponding to the frequency of the system clock signal. The clock sensing circuitry includes a plurality of series-connected time-delay circuits through which a signal derived from the system clock signal propagates. The clock sensing circuitry also includes a plurality of latch circuits, each coupled with a respective one of the time delay circuits and latching the value of the signal reaching the respective time delay circuit. The speed signal is then derived from these latched signal values, indicating through how many of the time-delay circuits the signal has propagated. The memory device also includes a control signal delay circuit that receives an internal memory control signal and the speed signal, and responsively produces a delayed control signal having a time delay corresponding to the speed signal value. The control signal delay circuit includes a plurality of series-connected time-delay circuits, with the memory control signal propagating through a selected number of these circuits. The control signal delay circuit also includes a selection circuit that receives the speed signal and correspondingly routes the memory control signal through the selected number of the time-delay circuits, with the selected number corresponding to the value of the speed signal.

29 Claims, 5 Drawing Sheets

METHOD AND APPARATUS FOR ADJUSTING CONTROL SIGNAL TIMING IN A MEMORY DEVICE

CROSS-REFERENCE TO RELATED APPLICATION

This application is a continuation of pending U.S. patent application Ser. No. 09/361,025, filed Jul. 23, 1999 now U.S. Pat. No. 6,111,812.

TECHNICAL FIELD

The present invention relates generally to control signal timing in semiconductor memory devices, and more particularly to a method and apparatus for selectively adjusting control signal timing in such memory devices.

BACKGROUND OF THE INVENTION

Semiconductor memory devices are used in a wide variety of applications. Such memory devices receive data for storage, in what is called a Write operation, and provide stored data to devices external to the memory, in what is called a Read operations. Typically, the memory device is accessed through a bus or multiple bus system by an external device or bus-master, such as a microprocessor, memory controller, or application specific integrated circuit (ASIC). The bus transfers address, data, and control signals between the memory device and the bus-master accessing the memory device.

Many of today's high speed memory devices, such as static random access memories (SRAMs), may operate at speeds greater than the capability of a bus-master accessing the SRAM. In a Read operation, for example, the SRAM may provide the data earlier than a time at which the bus-master is ready to retrieve such data. Bus contention may then result, in which data read from the SRAM is driven onto the bus while other data still resides on the bus. Consequently, two or more devices are sourcing/sinking relatively high currents for some conflicting period of time, thereby increasing risk of latchup effects, increasing system power consumption, increasing power and ground noise, and potentially resulting in erroneous data values.

To avoid such bus contention problems, designers of systems including high speed memories often insert idle time between successive data transfer operations, thereby reducing system speed to significantly less than optimal levels. Additionally, system designers often match speed specifications of various devices included within the system. As such, a system designer may not be able to use a readily available and inexpensive memory device in a system having other components too slow to match the speed of the memory device.

SUMMARY OF THE INVENTION

In accordance with the present invention, a method and apparatus is provided for selectively adjusting control signal timing in an integrated circuit, such as a memory device, that receives a clock signal and performs internal operations including producing a control signal. Clock sensing circuitry receives the clock signal and responsively produces a speed signal having a value corresponding to the frequency of the clock signal. Control signal delay circuitry receives the control signal and the speed signal, and responsively produces a delayed. control signal, with the time-delay relative to the control signal corresponding to the speed signal value.

The control signal may be any of a wide variety of control signals produced internal to a memory device and controlling the internal operations thereof. For example, the control signal may be a data output control signal controlling the timing of operations of data output circuitry included within the memory device. As another example, the control signal may be an address select control signal controlling the timing of access to an addressed location within the memory device.

The clock sensing circuitry may include a plurality of series-connected time-delay circuits, each able to receive a signal at its input and produce a corresponding time-delayed signal at its output. The clock signal is received at the input of a first of the time-delay circuits. The clock sensing circuitry may further include a plurality of latching circuits, each coupled with respective one of the time-delay circuits and latching the value of the respective time-delayed signal. The speed signal value may then correspond with the combination of latched values.

The control signal delay circuitry may include a plurality of time-delay circuits, each able to receive a signal at its input and produce a corresponding time-delay signal at its output with the control signal propagating through a selected number of these circuits. The control signal delay circuitry may further include delay select circuitry that receives the speed signal and correspondingly routes the memory control signal through a selected number of the time-delay circuits, with the selected number corresponding to the value of the speed signal.

By sensing the clock frequency and correspondingly adjusting control signal timing within the memory device, the speed of the memory device may be advantageously adjusted to match that of other components within the system. Among a number of advantages achieved in accordance with embodiments of the present invention, an SRAM device may be included within systems having operating speeds that would otherwise be too slow for the high speed access time of the SRAM device.

DETAILED DESCRIPTION OF THE INVENTION

The following is a description of a method and apparatus for adjusting control signal timing in a memory device. In this description, certain details are set forth in order to provide a thorough understanding of various embodiments of the present invention. It will be clear to one skilled in the art, however, that the present invention may be practiced without these details. In other instances, well-known circuits, circuit components, and control signals and associated timing protocols have not been shown or described in detail in order to avoid unnecessarily obscuring the description of the various embodiments of the invention.

Figure 1:
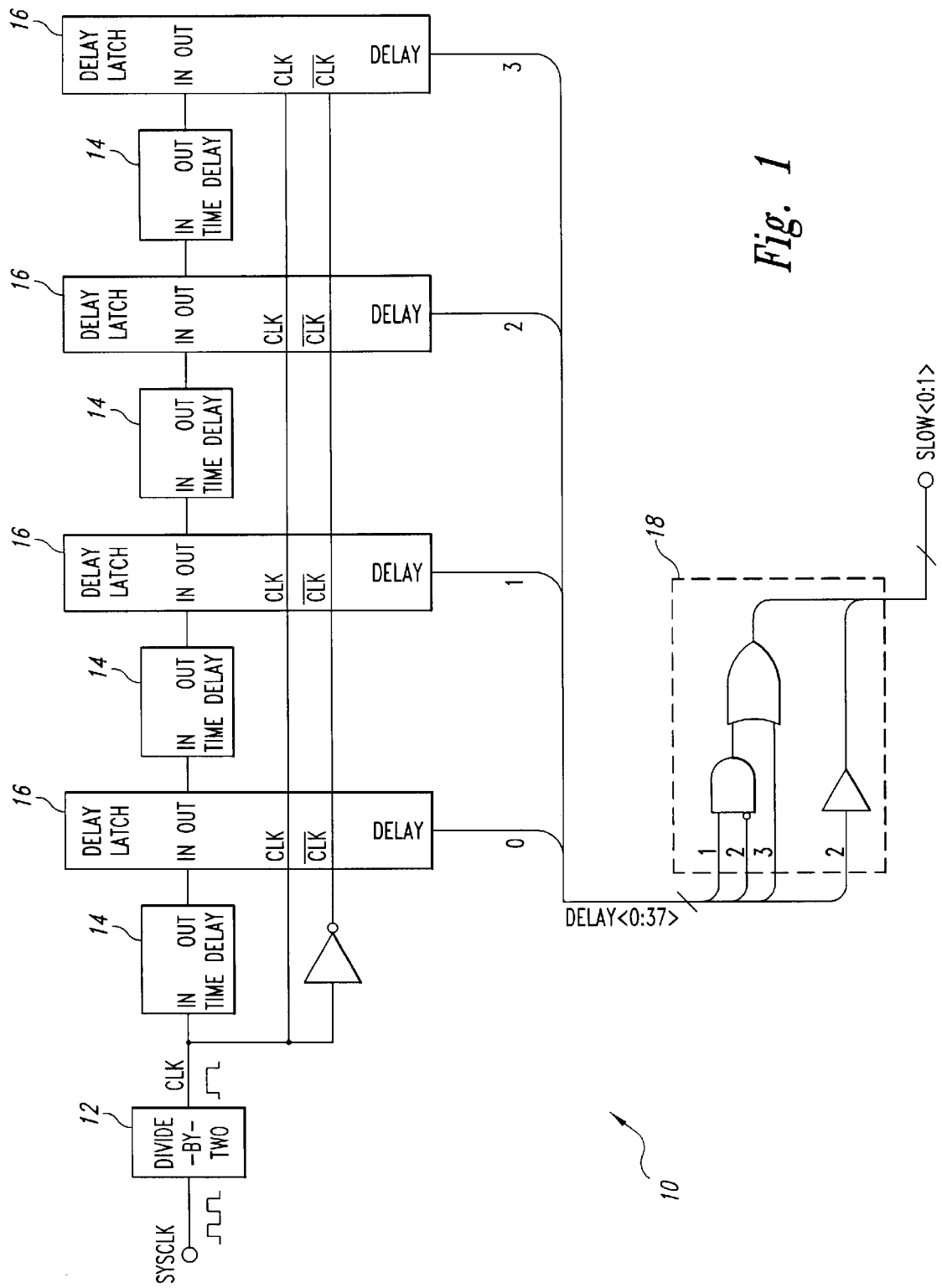
FIG. 1 is a part functional block, part logic circuit diagram depicting a clock sensing circuit in accordance with an embodiment of the present invention.

FIG. 1 depicts a clock sensing circuit 10 in accordance with an embodiment of the present invention. The clock sensing circuit 10 receives a clock signal SYSCLK, senses the frequency of the clock signal, and produces a clock speed signal SLOW<0:1> having a value corresponding to the frequency of the clock signal. The clock signal SYSCLK may be a system clock signal, such as that used to control data transfer operations between a memory device and a processor, system controller, or other bus-master.

The clock sensing circuit 10 receives the clock signal SYSCLK at a toggle or divide-by-two circuit 12 that responsively produces a clock signal CLK having one-half the frequency of SYSCLK- The clock signal CLK is then routed through a plurality of series-connected time-delay circuits 14, which may be any of a wide variety of well-known circuits for delaying signal transmission. The time-delay circuits 14 may be of identical construction and may provide substantially the same time delay. Alternatively, the time-delay circuits 14 may vary, both in the particular circuit implementation and in the signal time-delay produced, as desired. One or more of the time-delay circuits 14 may include Reset inputs (not shown) to reset output signal states in response to, for example, a rising edge of the clock signal CLK.

The clock sensing circuit 10 also includes a plurality of delay latch circuits 16, each coupled with a respective one of the time-delay circuits 14. Each of the delay latch circuits 16 receives the delayed clock signal output by the respective one of the time-delay circuits 14 and passes this signal to the input of a next one of the time-delay circuits. Each of the delay latch circuits 16 also receives the undelayed clock signal CLK and its complement $\overline{CLK}$, which serve as latching control signals to latch the value of the delayed clock signal output by the respective one of the time-delay circuits 14. The latched value of the delayed clock signal is provided at a latched output of the delay latch circuit 16 as part of a four line delay signal DELAY<0:3>. As desired, the delay latch circuits 16 may also include direct Latch, Reset, and/or Disable inputs and associated internal circuitry (not shown) to directly latch signal values, reset signal values, and/or disable the delay latch circuits independent of the state of the clock signal CLK.

The delayed clock signal propagates through the series of time-delay circuits 14 and respective delay latch circuits 16, with the time delay being progressively greater as determined by the number of time-delay circuits through which the signal propagates. The undelayed clock signal CLK and its complement $\overline{CLK}$ latch the state of the delayed clock signal in each of the delay latch circuits 16, thereby indicating how far the delayed clock signal has propagated through the series of time-delay circuits 14. Given the contemplated frequencies of the clock signal SYSCLK and the signal propagation delay provided by a first of the time-delay circuits 14, a high state of the delayed clock signal will reach at least a first of the delay latch circuits 16 prior to latching. The delay signal DELAY<0:3> then has four possible values (1000, 1100, 1110, or 1111), depending on how far the delayed clock signal has propagated through the time-delay circuits 14. The delay signal DELAY<0:3> is converted into a two bit clock speed signal SLOW<0:1> in a conventional fashion, such as by employing the particular conversion logic circuitry 18 shown in FIG. 1.

As will be described in detail below, each of the delay latch circuits 16 has its delay signal output set to a logic low state (or zero) in response to a rising edge of the clock signal CLK. The clock signal propagates through the series of time-delay circuits 14 and delay latch circuits 16, with each of the delay latch circuits then latching the output signal of the respective time-delay circuit 14 in response to a falling edge of the clock signal CLK. Each of the component signals of the delay signal DELAY<0:3> is high or low depending on whether the delayed high state of the clock signal CLK has reached the corresponding delay latch circuit 16 when the falling edge of the clock signal CLK is applied to the delay latch. Because the clock signal CLK is one-half the frequency of the clock signal SYSCLK, those skilled in the art will appreciate that the signal latched by each of the delay latch circuits 16 indicates whether a first SYSCLK pulse has reached the corresponding delay latch at the time the next sequential SYSCLK pulse occurs. By latching in how far the first system clock pulse has propagated through the time-delay circuits 14, a functional measurement of system clock frequency is achieved, with the produced speed signal SLOW<0:1> having a binary value inversely corresponding to that frequency. The speed signal SLOW<0:1> may then be applied, as described in detail below, to adjust the timing of a variety of control signals used in data access and/or transfer operations.

While FIG. 1 shows four time-delay circuits 14 and four associated delay latch circuits 16, those skilled in the art will appreciate that a greater number may be advantageously employed. In a currently preferred embodiment, eight delay latch circuits are used, together with respective time-delay circuits. The correspondingly produced speed signal SLOW is then a three bit signal. By using a larger number of delay latch circuits and time-delay circuits, the functional measurement of clock signal frequency can be performed with greater specificity than in the particular embodiment depicted in FIG. 1.

Those skilled in the art will appreciate that the above-described clock sensing circuit 10 essentially compares the period of the clock signal SYSCLK to various time intervals. For example: if the period is greater than the time delay produced by a first of the time-delay circuits 14, then the respective first of the delay latch circuits 16 latches a logic high state delay signal; if the period is greater than the time delay produced by the first and a second of the time-delay circuits 14, then the respective first and second of the delay latch circuits 16 each latch a logic high state delay signal; etc.

Figure 2:
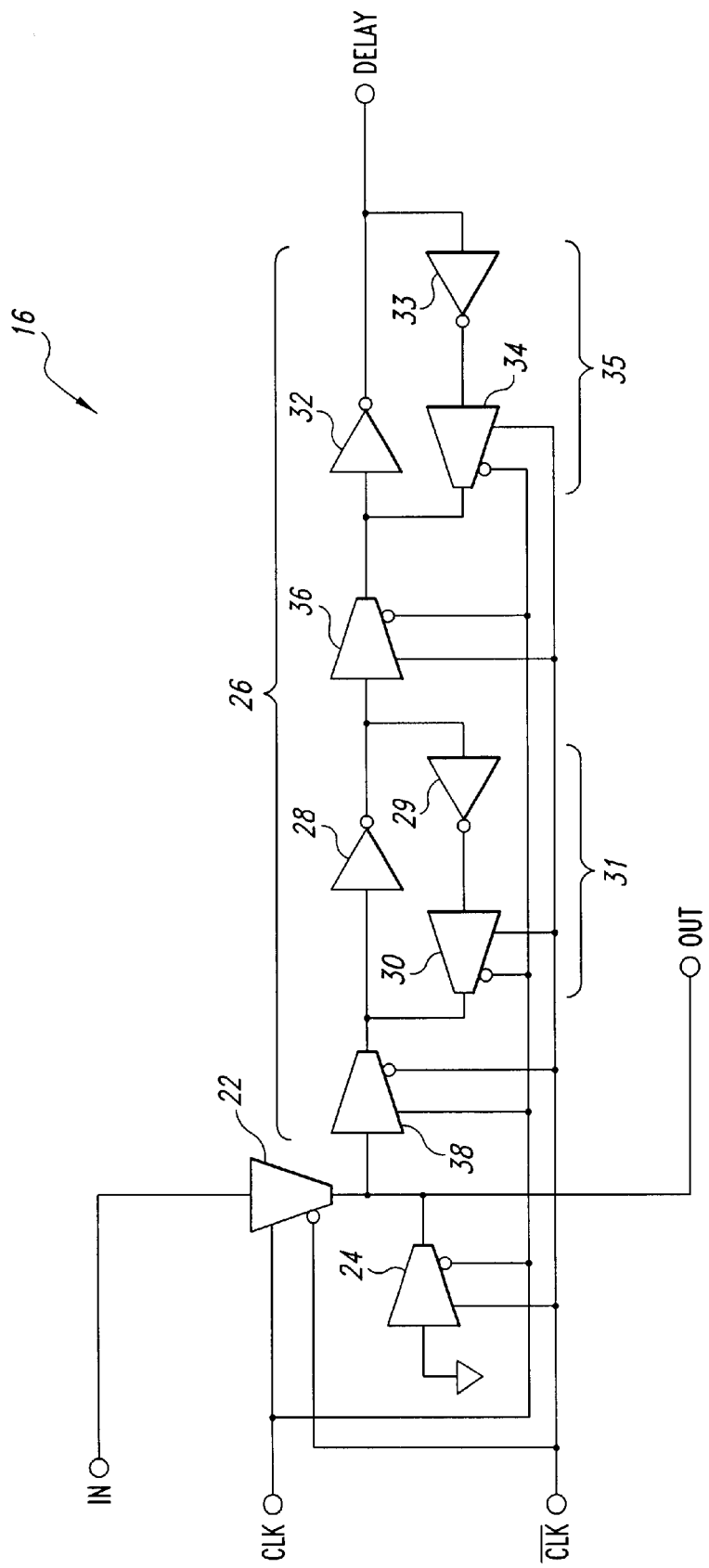
FIG. 2 is a logic circuit diagram depicting a delay latch circuit included in the clock sensing circuit of FIG. 1.

FIG. 2 shows one of many possible implementations of one of the delay latch circuits 16 shown in FIG. 1. The depicted delay latch circuit 16 includes a transmit pass gate 22 and a reset pass gate 24. When the clock signal CLK has a logic low state (and hence $\overline{CLK}$ a logic high state), the transmit pass gate 22 isolates the output from the input, and the reset pass gate 24 pulls the output of the delay latch circuit 16 to a logic low state such as ground potential. When the clock signal CLK has a logic high state (and hence $\overline{CLK}$ a logic low state), the transmit pass gate 22 passes a signal from the input to the output of the delay latch circuit 16. The delay latch circuit 16 also includes a master-slave latch 26 that responds to the falling edge of the clock signal CLK to latch the state of the output signal as the DELAY signal.

The latch 26 is formed from inverters and pass gates in a conventional configuration. First and second inverters 28, 29 and a first pass gate 30 form a master latch 31. Third and fourth inverters 32, 33 and a second pass gate 34 form a slave latch 35. A third pass gate 36 is coupled between the master latch 31 and the slave latch 35 to selectively connect or isolate the slave latch from the master latch. A fourth pass gate 38 is coupled with the input of the master latch 31 to selectively transmit the output signal of the delay latch circuit 16 to the master latch. When the clock signal CLK has a logic high state, the second pass gate 34 and the fourth pass gate 38 are turned on, while the first pass gate 30 and the third pass gate 36 are off. Thus, the slave latch 35 is isolated from the master latch 31, and the feedback loop of the slave latch is closed, thereby latching its previous state. The feedback loop of the master latch 31 is open and the output of the master latch simply follows the complement of the output signal of the delay latch circuit 16. When the clock signal CLK transitions to a logic low state, the on or off states of the pass gates 30, 34, 36, and 38 switch. The master latch 31 is then disconnected from the output signal produced by the delay latch circuit 16, and the master latch feedback loop is closed, thereby latching the complement of the delay latch circuit output signal immediately prior to the falling edge of the clock signal CLK. This latched signal state is passed by the pass gate 36 to the slave latch 35. The feedback loop of the slave latch 35 is open, and its output correspondingly follows the complement of the signal latched by the master latch 31. Thus, upon the transition of the clock signal CLK from a logic high to a logic low state, the logic state of the DELAY signal takes on a value equal to that of the output signal produced by the delay latch circuit 16 immediately preceding the transition of the clock signal.

Figure 3:
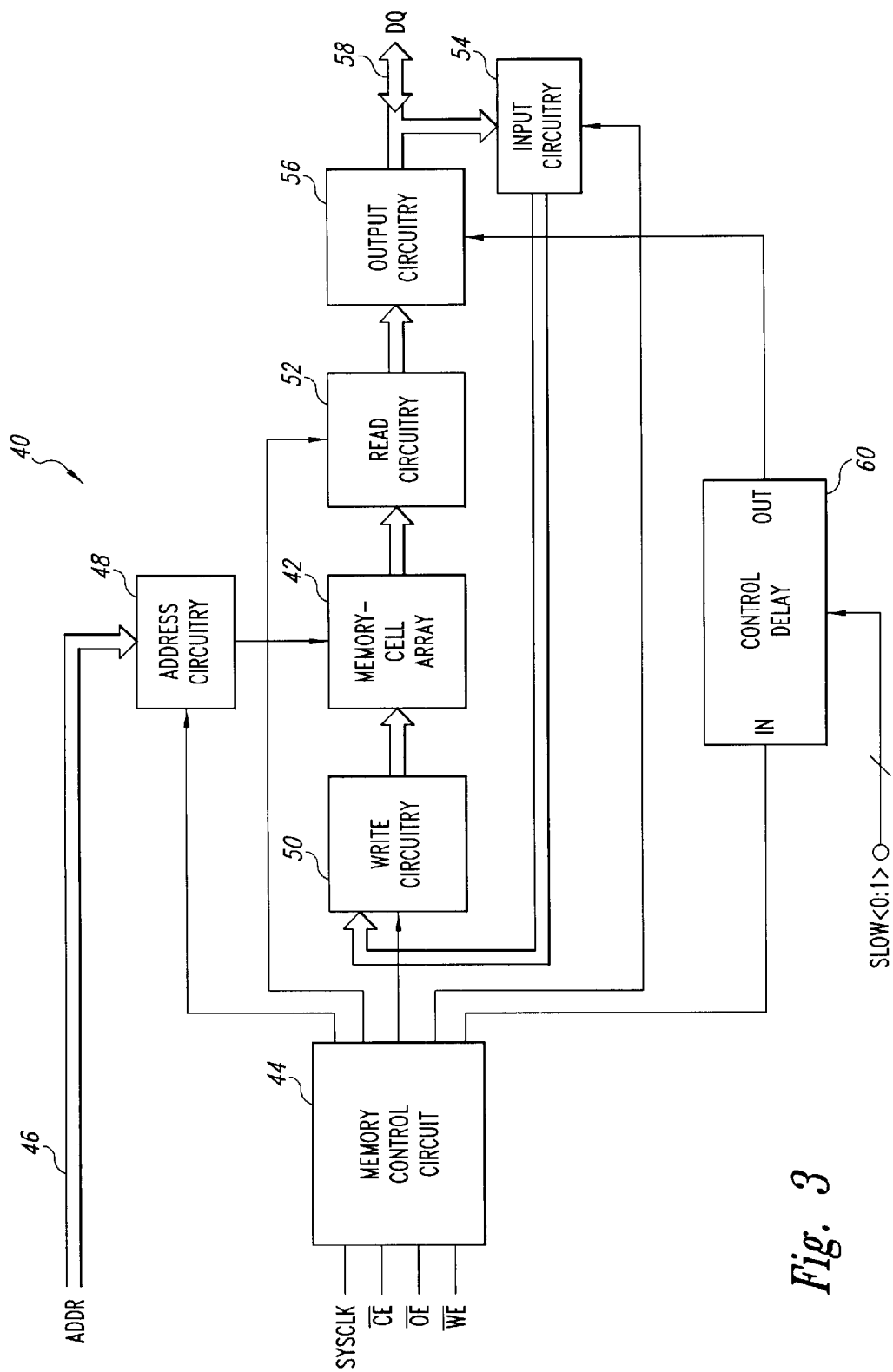
FIG. 3 is a functional block circuit diagram depicting a memory device having an adjustable control signal delay circuit in accordance with an embodiment of the present invention.

FIG. 3 depicts one of many possible applications using the speed signal SLOW<0:1> produced by the clock sensing circuit 10 of FIG. 1. FIG. 3 depicts a memory device 40 that includes a memory cell array 42 and operates in accordance with a plurality of internal control signals produced by a memory control circuit 44. A device external to the memory device 40 applies a plurality of command signals to the memory control circuit 44, including well-known signals such as write-enable ($\overline{WE}$), output enable ($\overline{OE}$), chip enable ($\overline{CE}$). The memory control circuit 44 also receives the system clock signal SYSCLK. Those skilled in the art will understand that each of the depicted control signals may itself represent a plurality of associated control signals, and that additional well-known control signals may be included depending on the particular type of memory device 40 (whether an SRAM, synchronous DRAM, etc.).

An address ADDR is applied to the memory device 40 on an address bus 46. The address ADDR may be a single applied address, as in the case of an SRAM, or maybe a time-multiplexed address, as in the case of a DRAM. In response to one or more control signals provided by the memory control circuit 44, address circuitry 48 decodes the address ADDR, selects corresponding locations within the memory cell array 42, and initiates access to these locations. As is known to those skilled in the art, the depicted address circuitry 48 includes a variety of functional components particular to the memory device type. For example, the address circuitry 48 might include address burst counter and multiplexer circuitry, together with activation and address select circuitry appropriate to the particular memory device type.

In response to one or more control signals provided by the memory control circuit 44, write circuitry 50 writes data to addressed locations within the memory cell array 42. Those skilled in the art know that the depicted write circuitry 50 includes a variety of functional components particular to the memory device type. For example, the write circuitry 50 might include byte enable circuitry and write driver circuitry. In response to one or more control signals provided by the memory control circuit 44, read circuitry 52 retrieves data stored in the address locations within the memory cell array 42. Those skilled in the art know that the depicted read circuitry 52 includes a variety of functional circuit components particular to the memory device type. For example, the read circuitry 52 might include sense amplifier circuitry and I/O gating circuitry.

In response to one or more control signals provided by the memory control circuit 44, data input and data output circuits 54 and 56 are selectively connected to a data bus 58 to input and output data D and Q to and from the memory device 40, all respectively. The data input circuitry 54 receives data from the data bus 58 and provides it to the write circuitry 50 for storage in an addressed location of the memory cell array 42. The data output circuitry 56 receives data retrieved by the read circuitry 52 and provides this data to external devices via the data bus 58. Those skilled in the art know that the depicted data input and out circuits 54 and 56 may include a variety of functional circuit components, such as buffering and register circuitry.

In accordance with an embodiment of the present invention, an adjustable control signal delay circuit 60 is included within the memory device 40. In the particular depiction of FIG. 3, the control signal delay circuit 60 couples the memory control circuit 44 with the data output circuit 56. The control signal delay circuit 60 receives the speed signal SLOW<0:1> and adjusts the time delay of the control signal corresponding to the particular value of the speed signal. As one example, the timing of data transfer from the read circuitry 52 to the data output circuitry 56 may be controlled by adjusting the timing of the internally generated data clock signal that clocks read data into the output circuitry. As another example, the control signal delay circuit 60 may selectively adjust the timing of the internally generated output enable signal applied to the data output circuitry 56, to selectively control the timing of the low impedance connection to the data bus 58. Of course, those skilled in the art will appreciate that the control signal delay circuit 60 may be used to adjust timing of a wide variety of control signals within the memory device 40, and not just those associated with the depicted data output circuitry 56.

Figure 4:
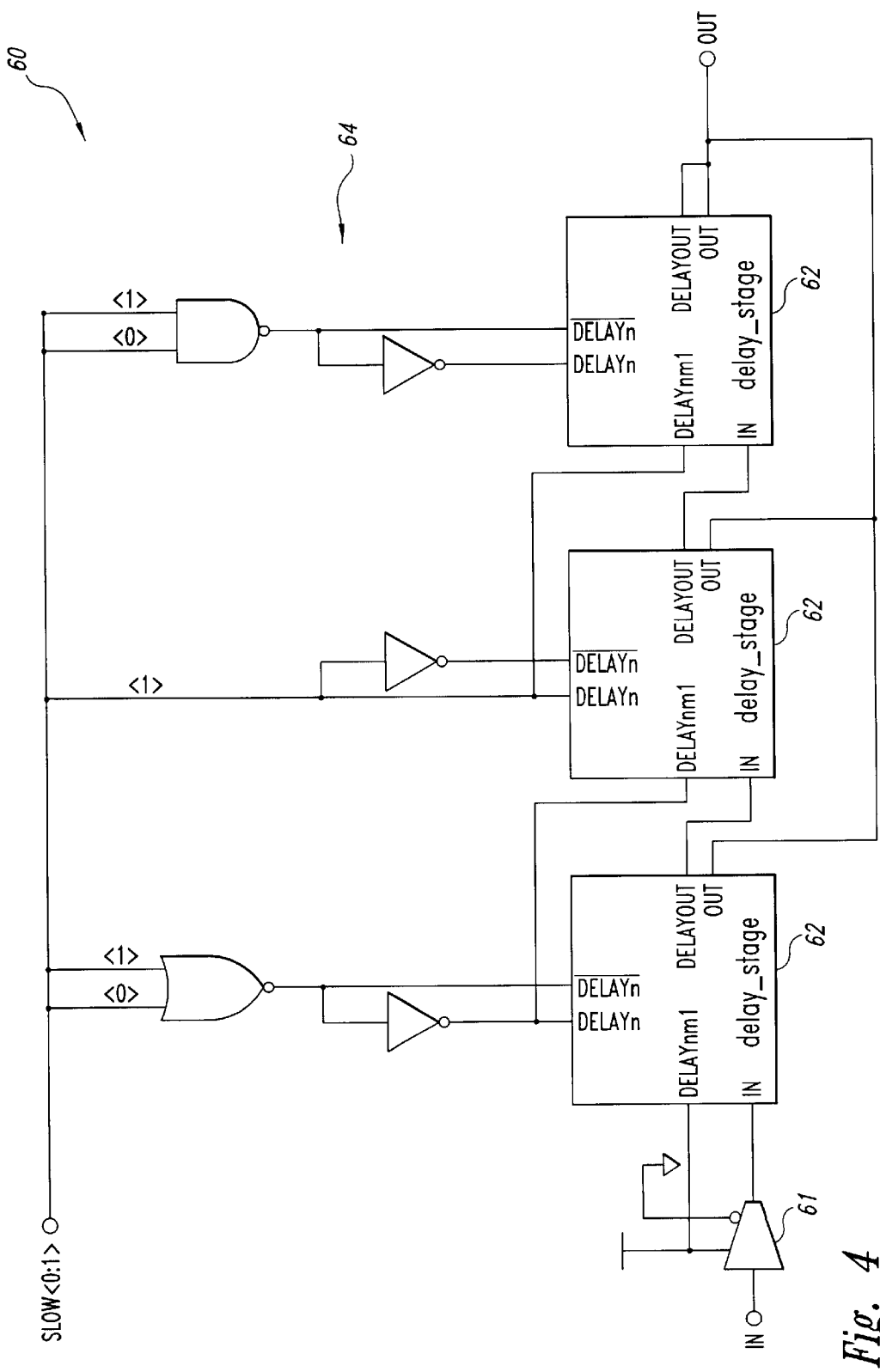
FIG. 4 is a part functional block, part logic circuit diagram depicting the control signal delay circuit of FIG. 3.

FIG. 4 shows one possible embodiment of the control signal delay circuit 60. A signal input to the control signal delay circuit 60 is output after passing through a pass gate 61 and a selected number of a plurality of time-delay stages 62, with the selected number being determined by the value of the speed signal SLOW<0:1>. Logic circuitry 64 samples the signal state of the various components of the speed signal SLOW<0:1> and applies corresponding delay control and complement signals DELAY n and $\overline{DELAYn}$, respectively, to the time-delay stages 62. Each of the time-delay stages 62 also receives the delay control signal applied to the immediately preceding time-delay stage at a delay-n-minus-1 input DELAYnm1. Depending on the states of these signals, and as will be described in detail below, each of the time-delay stages does one of two things: passes an input signal directly to an output OUT to bypass subsequent time-delay stages; or delays the input signal and passes it to a delay output DELAYOUT for provision to the input IN of a next of the time-delay stages 62. Depending on whether the decimal value of the speed signal SLOW<0:1> is 0, 1, 2, or 3, the signal input to the control signal delay circuit 60 will correspondingly be delayed not at all by the first of the time-delay stages 62, be delayed by the first of the time-delay stages, be delayed by the first and a second of the time-delay stages, or be delayed by the first, the second and a third of the time-delay stages.

As discussed in connection with FIG. 1, those skilled in the art will appreciate that the frequency of the clock signal SYSCLK may be functionally measured with higher specificity, and the timing of control signals may be correspondingly adjusted. As discussed above, the presently preferred embodiment includes circuitry that provides a three bit speed signal SLOW. Correspondingly, the control signal delay circuit 60 would then include seven time-delay stages instead of the three time-delay stages 62 depicted in FIG. 4.

Figure 5:
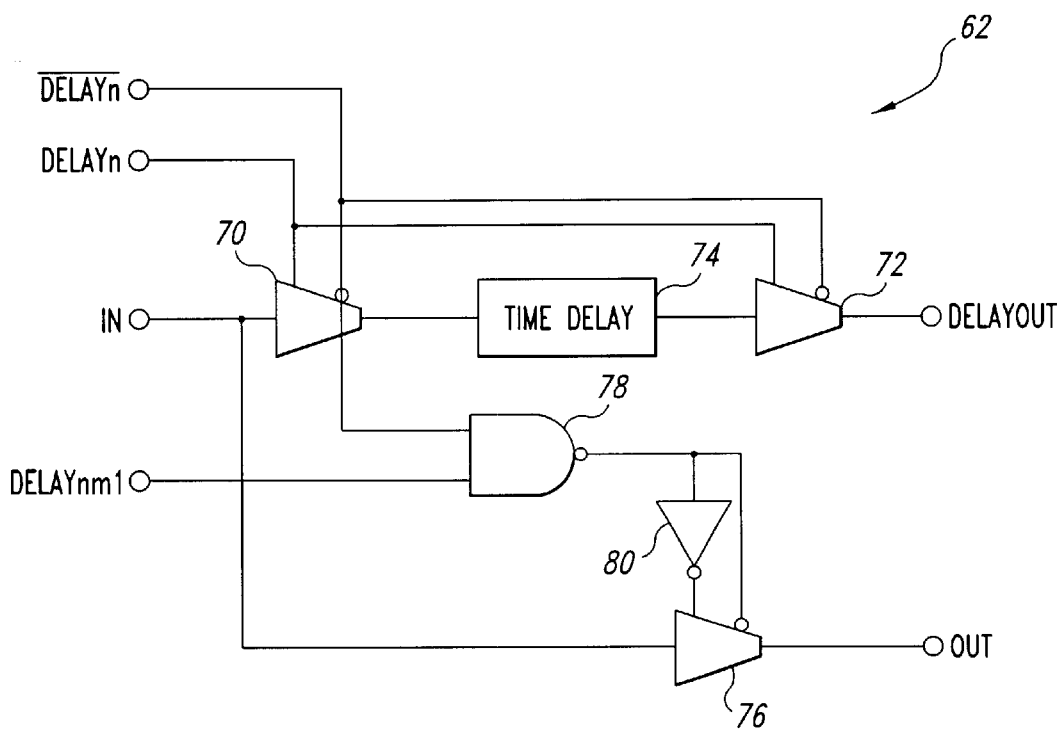
FIG. 5 is a part functional block, part logic circuit diagram depicting a delay stage circuit included in the control signal delay circuit of FIG. 4.

FIG. 5 shows one possible implementation of the time-delay stage 62. The delay control and complement signal DELAY n and $\overline{\text{DELAYn}}$ are each applied to an input pass gate 70 and a delay output pass gate 72. A time-delay circuit 74 is coupled between the input pass gate 70 and the delay output pass gate 72. The time-delay circuit 74 may be any of a wide variety of well-known circuits for delaying signal transmission. If the logic state of DELAY n is high (and its complement $\overline{\text{DELAYn}}$ therefore low), the pass gates 70 and 72 are enabled and the signal input to the time-delay stage 62 is routed through the time-delay circuit 74 and provided as a delayed output signal DELAYOUT.

If the logic state of DELAY n is low (and its complement $\overline{\text{DELAYn}}$ therefore high), the pass gates 70, 72 are disabled. Logic circuitry consisting of a NAND gate 78 and an inverter 80 selectively enables or disables an output pass gate 76. If the logic state of DELAYn is low and the logic state of DELAYnm1 is high, the output pass gate 76 is enabled to directly route the signal input to the time-delay stage 62 to an output without a time delay. If the logic state of DELAYn is low and the logic state of DELAYnm1 is low, the pass gate 76 is disabled. To summarize: (i) if DELAYn is high, the signal input to the time-delay state 62 is routed to through the time-delay circuit 74 and provided as a delayed output signal DELAYOUT; (ii) if DELAYn is low and DELAYnm1 is high, the signal input to the time-delay stage is routed (without delay) to the output OUT; (iii) if DELAYn is low and DELAYnm1 is low, no signal path through the time-delay stage exists, with the time-delay stage, then being bypassed as described above in connection with FIG. 4.

Figure 6:
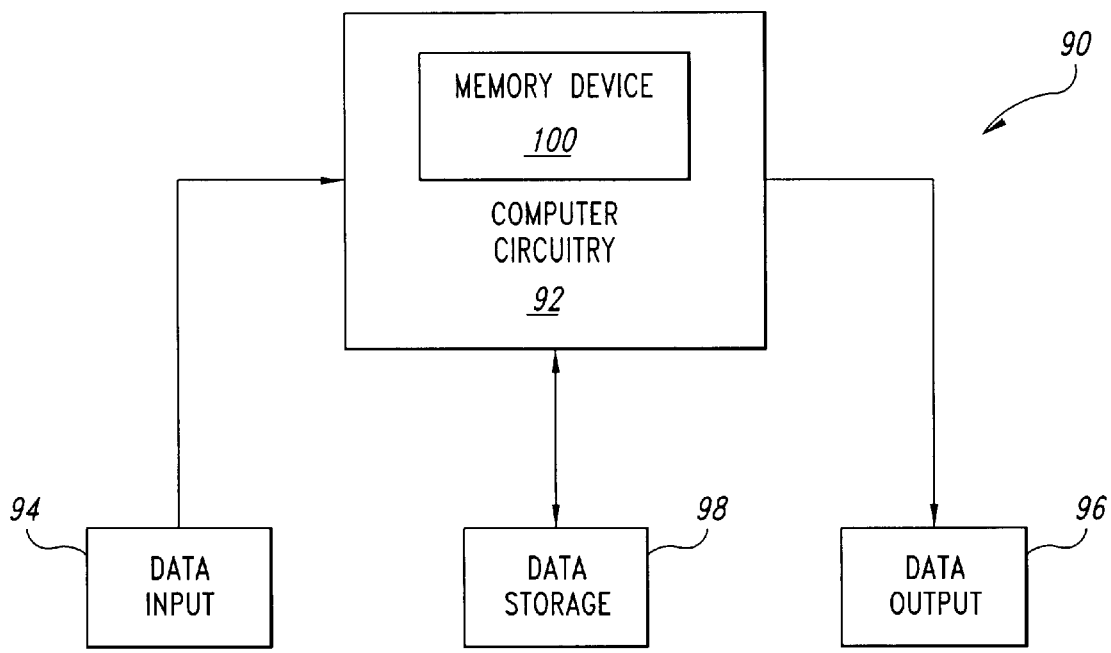
FIG. 6 is a functional block diagram depicting a computer system having a memory device in accordance with an embodiment of the present invention.

FIG. 6 is a functional block diagram depicting a computer system 90 which includes a memory device 100 constructed in accordance with the present invention. For example, the memory device 100 could be of configuration similar to the memory device 40 and equivalents described above in connection with FIG. 3. The computer system 90 includes computer circuitry 92 for performing such functions as executing software to accomplish desired calculations and tasks. The computer circuitry 92 includes at least one processor (not shown) and the memory device 100, as shown. A data input device 94 is coupled to the computer circuitry 92 to allow an operator to manually input data thereto. Examples of data input devices 94 include a keyboard and a pointing device. A data output device 96 is coupled to the computer circuitry 92 to provide data generated by the computer circuitry to the operator. Examples of data output devices 96 include a printer and a video display unit. A data storage device 98 is coupled to the computer circuitry 92 to store data and/or retrieve data from external storage media. Examples of storage devices 98 and associated storage media include drives that accept hard and floppy disks, magnetic tape recorders, and compact-disc read-only memory (CD-ROM) drives.

It will be appreciated that, although specific embodiments of the present invention have been described above for purposes of illustration, various modifications may be made without deviating from the spirit and scope of the invention. As just one example, a number of alternative circuit implementations may be functionally substituted for the particularly described delay latch circuits 16 and time-delay stages 62. Indeed, those skilled in the art will understand that a number of suitable circuits can be adapted and combined to implement selective adjustment of control signal timing in a memory device or other integrated circuit. Accordingly, the invention is not limited by the disclosed embodiments, but instead the scope of the invention is determined by the following claims.

What is claimed is:

1. An apparatus for sensing the frequency of a clock signal and producing timing data corresponding to the frequency, the apparatus comprising:
   a plurality of delay circuits coupled in series, the first delay circuit in the series coupled to receive the clock signal, each delay circuit providing a progressively delayed version of the clock signal;
   a corresponding plurality of latches, each latch coupled to a respective delay circuit to latch the state of the respective delayed clock signal in response to a transition of the clock signal; and
   a combination circuit coupled to the plurality of latches to combine the latched states to produce timing data.

2. The apparatus of claim 1 wherein the combination circuit produces timing data represented by a number of bits equal to $\log_2$(number of latches).

3. The apparatus of claim 1 wherein each of the plurality of latches comprises a two-stage latch circuit having a grounding circuit to reset the latch.

4. The apparatus of claim 1 wherein the latches latch the state of the respective delayed clock signals in response to a transition of the clock signal from a logic high to a logic low state.

5. The apparatus of claim 1 wherein the transition of the clock signal represents the completion of one period of a system clock signal.

6. A control signal timing circuit for adjusting the timing of a control signal, comprising:
   clock sensing circuitry operable to receive a clock signal and provide a timing signal indicative of a relative delay of the clock signal with respect to a plurality of progressively delayed versions of the clock signal; and
   control signal delay circuitry coupled to receive the control signal and further coupled to the clock sensing circuitry to receive the timing signal, the control signal delay circuitry operable to produce a delayed control signal having a delay with respect to the control signal corresponding to the timing signal.

7. The apparatus of claim 6 wherein the clock signal has a frequency one-half the frequency of a system clock signal.

8. The apparatus of claim 6 wherein the clock sensing circuitry comprises:
   a plurality of delay circuits coupled in series, the first delay circuit in the series coupled to receive the clock signal, each delay circuit providing a progressively delayed version of the clock signal; and
   a corresponding plurality of latches, each latch coupled to a respective delay circuit to latch the state of the respective delayed clock signal in response to a transition of the clock signal.

9. A control signal tiling circuit according to claim 6 wherein the control signal delay circuitry comprises:
   a plurality of time-delay circuits, each circuit providing a time-delayed signal at an delayed output and an undelayed signal at an undelayed output; and routing circuitry operable to route the control signal through a selected number of the time-delay circuits according to the value of the timing signal.

10. A clock speed sensing circuit for producing a speed signal having a value corresponding to a frequency of a received clock signal, the sensing circuit comprising:

a plurality of time-delay circuits, each operable to receive a signal at its input and produce a corresponding time-delayed signal at its output, a first of the time-delay circuits receiving the clock signal in response to a first edge of the clock signal; and a plurality of latching circuits, each coupled with a respective one of the time-delay circuits and operable to latch a value of the respective time-delayed signal from which the speed signal is produced in response to a second edge of the clock signal.

11. The clock speed sensing circuit according to claim 10 wherein the second edge of the clock signal represents the completion of one period of a system clock signal.

12. The clock speed sensing circuit according to claim 10 wherein the speed signal value corresponds with the combination of latched time-delayed signal values.

13. The clock speed sensing circuit according to claim 10 wherein the speed signal is a multi-bit digital signal having a value corresponding with the combination of latched time-delayed signal values.

14. A method for sensing a frequency of a clock signal, comprising:

progressively delaying the clock signal to produce a plurality of increasingly delayed clock signals; and determining the states of the increasingly delayed clock signals in response to a transition of the clock signal to use as representative of the frequency of the clock signal.

15. The method of claim 14 wherein progressively delaying the clock signal comprises propagating the clock signal through plurality of series coupled time-delay circuits.

16. The method of claim 15 wherein determining the states of the increasingly delayed clock signals comprises determining the number of time-delay circuits through which the clock signal has propagated when the transition of the clock signal occurs.

17. The method of claim 14 wherein determining the states of the increasingly delayed clock signals comprises latching the state of each delayed clock signal in response to the transition of the clock signal.

18. A method for sensing a frequency of a clock signal, comprising:

generating from the clock signal a plurality of progressively delayed versions of the clock signal;

latching a state of each of the plurality of the progressively delayed versions of the clock signal in response to a transition of the clock signal; and generating from the latched states of the progressively delayed clock signals timing data having a value corresponding to the frequency of the clock signal.

19. The method of claim 18 wherein generating the timing data comprises combining the states of the delayed clock signals into a value represented by $\log_2$(number of progressively delayed clock signals) bits.

20. The method of claim 18 wherein generating the timing data comprises combining the states of the delayed clock signals using logic gates.

21. The method of claim 18 wherein generating the plurality of progressively delaying the clock signal comprises propagating the clock signal through plurality of series coupled time-delay circuits.

22. A method for controlling the timing of a control signal with respect to a clock signal, comprising:

providing speed data indicative of the relative delay of the clock signal with respect to a plurality of progressively delayed versions of the clock signal to a delay circuit receiving the control signal; and delaying the control signal in accordance with the speed data.

23. The method of claim 22 wherein delaying the control signal comprises selecting a number of time-delay circuits through which to route the control signal according to the speed data.

24. The method of claim 22 wherein delaying the control signal comprises adjusting a time delay corresponding with the value of the speed data.

25. A clock speed sensing circuit for producing a speed signal having a value corresponding to a frequency of a received clock signal, the sensing circuit comprising:

a plurality of time-delay circuits, each operable to receive a signal at its input and produce a corresponding time-delayed signal at its output, a first of the time-delay circuits receiving the clock signal; and a plurality of latching circuits, each coupled with a respective one of the time-delay circuits and operable to latch a value of the respective time-delayed signal from which the speed signal is produced, the speed signal being produced from a combination of the latched time-delayed signal values.

26. The clock speed sensing circuit according to claim 25 wherein the second edge of the clock signal represents the completion of one period of a system clock signal.

27. The clock speed sensing circuit according to claim 25 wherein the speed signal is a multi-bit digital signal.

28. A clock speed sensing circuit for producing a speed signal having a value corresponding to the frequency of a received clock signal, the sensing circuit comprising:

a plurality of time-delay circuits, each operable to receive a signal at its input and produce a corresponding time-delayed signal at its output, a first of the time-delay circuits receiving the clock signal; and a plurality of latching circuits, each coupled with a respective one of the time-delay circuits and operable to latch a value of the respective time-delayed signal from which the speed signal is produced, the speed signal being a multi-bit digital signal having a value corresponding with a combination of the latched time-delayed signal values.

29. The clock speed sensing circuit according to claim 28 wherein the second edge of the clock signal represents the completion of one period of a system clock signal.

* * * * *

UNITED STATES PATENT AND TRADEMARK OFFICE
CERTIFICATE OF CORRECTION

PATENT NO. : 6,304,511 B1
DATED : October 16, 2001
INVENTOR(S) : Dean Gans, John R. Wilford and Joseph T. Pawlowski Page 1 of 1

It is certified that error appears in the above-identified patent and that said Letters Patent is hereby corrected as shown below:

<u>Column 8,</u>
Line 63, reads "tiling" should read -- timing --

<u>Column 9,</u>
Line 37, reads "plurality" should read -- a plurality --

<u>Column 10,</u>
Line 6, reads "plurality" should read -- a plurality --

Signed and Sealed this

Twenty-first Day of May, 2002

Attest:

Attesting Officer

JAMES E. ROGAN
Director of the United States Patent and Trademark Office